United States Patent
Brambilla et al.

(10) Patent No.: US 6,350,671 B1
(45) Date of Patent: Feb. 26, 2002

(54) METHOD FOR AUTOALIGNING OVERLAPPED LINES OF A CONDUCTIVE MATERIAL IN INTEGRATED ELECTRONIC CIRCUITS

(75) Inventors: Claudio Brambilla, Concorezzo; Manlio Sergio Cereda, Lomagna; Paolo Caprara, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/579,778

(22) Filed: May 26, 2000

(30) Foreign Application Priority Data

May 31, 1999 (EP) ............................................. 99830336

(51) Int. Cl.[7] .......................................... H01L 21/4263
(52) U.S. Cl. ......................... 438/618; 438/628; 438/687
(58) Field of Search ................................ 438/618, 622, 438/626, 627, 628, 687; 257/758, 759, 766, 792, 306

(56) References Cited

U.S. PATENT DOCUMENTS

| | | | |
|---|---|---|---|
| 5,801,443 A | 9/1998 | Ohno | 257/758 |
| 5,885,890 A | 3/1999 | Dennison | 438/597 |
| 5,904,569 A | 5/1999 | Kitch | 438/692 |
| 6,255,685 B1 * | 7/2001 | Kuroda | 257/306 |
| 6,265,301 B1 * | 7/2001 | Lee et al. | 438/618 |
| 6,265,753 B1 * | 7/2001 | Carter et al. | 257/708 |
| 6,271,593 B1 * | 8/2001 | Givens et al. | 257/752 |

FOREIGN PATENT DOCUMENTS

EP 0696060 A 7/1996

* cited by examiner

*Primary Examiner*—Michael Lebentritt
(74) *Attorney, Agent, or Firm*—Lisa Jorgenson; E. Russell Tarleton; Seed IP Law Group PLLC

(57) ABSTRACT

A method for autoaligning lines of a conductive material in circuits integrated on a semiconductor substrate is presented. The method includes forming several regions projecting from the substrate surface and aligned to one another, and forming a fill layer in the gaps between the projecting regions. The fill layer is planarized to expose the regions, and a portion of the regions is removed to form holes at the locations of the regions. Next an insulating layer is formed in the holes. The insulating layer is selectively removed to form spacers along the edges of said holes and at least one conductive layer is deposited over the exposed surface. Later, a step of photolithograpy with a mask is performed and the conductive layer is etched to define lines and collimate them to the underlying regions.

11 Claims, 7 Drawing Sheets

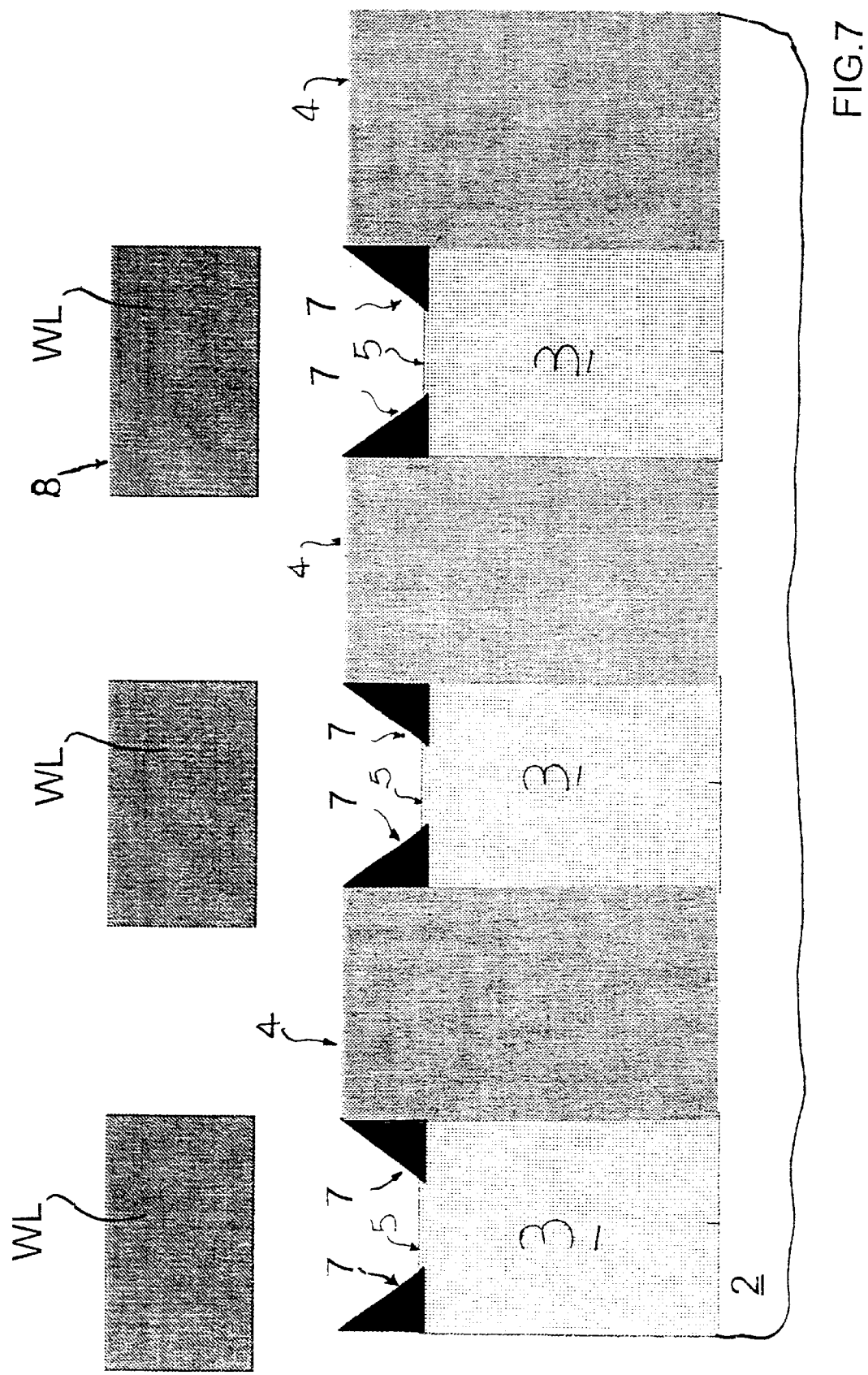

METHOD FOR AUTOALIGNING OVERLAPPED LINES OF A CONDUCTIVE MATERIAL IN INTEGRATED ELECTRONIC CIRCUITS

TECHNICAL FIELD

This invention relates to a method for autoaligning overlapped lines of a conductive material in electronic circuits integrated on a semiconductor substrate.

BACKGROUND OF THE INVENTION

Electronic EPROM or Flash EPROM memory devices integrated on a semiconductor substrate include a plurality of non-volatile memory cells arranged in a matrix form; that is, the cells are laid into rows, or word lines, and columns, or bit lines.

Each non-volatile memory cell includes an MOS transistor whose gate electrode, located above the channel region, is floating, that is, has a high D.C. impedance to all the other terminals of the cell and the circuit in which the cell is connected.

The cell also has a second electrode, called the control gate, which is coupled to the gate electrode and is driven by means of appropriate control voltages. The other transistor electrodes include the usual drain and source terminals.

In recent years, considerable effort has gone to the development of memory devices with ever higher circuit density. This effort has resulted in electrically programmable, contactless non-volatile memory matrices with a cross-point type of structure becoming available. An example of a matrix of this kind, and of its manufacturing process, is described in European Patent No. 0 573 728 to this Applicant, and hereby incorporated by reference.

In matrices of this type, the matrix bit lines are formed in the substrate as continuous parallel diffused strips. Following the formation of the gate regions of the matrix cells, the memory matrix appears as a series of posts (projecting elements) projecting from the semiconductor surface. At this stage, after filling the gaps which separate the various gate regions with a dielectric, the word lines of the memory matrix are formed which must be aligned to the gate regions of the cells appearing at the same row in the memory matrix.

The operation for defining and aligning a polysilicon line, such as that representing a word line of a memory matrix, to a previously defined polysilicon layer underneath is critical because their dimensions are comparable.

If a misalignment occurs in defining the upper word line, the underlying layer, which is usually made of the same material as the upper layer, is most likely to be etched away or damaged.

There exists a physical limitation to the alignment of material layers belonging to successive lithographic levels. This limitation applies most strictly to the manufacturing of memory cell matrices, where the geometrical dimensions are carried to the lower limit of the photolithographic process.

Shown in FIG. 1 is a portion 1' of a matrix of memory cells wherein the gate regions 2' of the memory cells have been formed.

Following the deposition of a fill layer 4', from which the gate regions 2' of the matrix will project, the polysilicon lines WL' are formed which are to be aligned to the gate regions 2'.

In conformity with well-established designing rules, to collimate, or to correctly fix the lines WL' to their corresponding gate regions, a variation X is allowed which is set by the photolithographic limitations.

Accordingly, it has become common practice to form the upper line with a width which exceeds by at least 2× the width of the underlying portion.

However, this solution has some drawbacks. Where the distance between two adjacent lines is exceedingly small and each line is made oversize, the lines may ultimately be too close together.

On the other hand, where the line WL' formed in the upper layer is the same width as the lower line, the underlying gate regions may suffer damage in the event of a photolithographic misalignment occurring during the definition of the line WL', as highlighted by FIG. 1.

In this case, it would become necessary to collimate the upper line to the line underneath.

Until now, there exists no method to align overlapped polysilicon lines, which allows the lines of conductive material to be collimated, removes the need for forming oversize lines, and overcomes the limitations with which prior methods are still beset.

SUMMARY OF THE INVENTION

Embodiments of this invention provide spacers on the line to which the upper line must be collimated, so as to increase the space available on the underlying line, instead of forming an oversize upper line.

A method is provided that autoaligns lines of a conductive material by first forming projecting regions on a semiconductor substrate, forming a fill layer in the gaps between the regions, and then planarizing the fill layer to expose a portion of the regions. Portions of the regions are etched, forming voids compared to the fill layer. These voids are filled with an insulating layer, then partially etched, at the center of the top surface of the regions only, which leaves an insulating structure at the top periphery of the regions.

The features and advantages of a device according to the invention will become apparent from the following description of an embodiment thereof, given by way of example and not of limitation with reference to the accompanying drawings. The invention relates, particularly but not exclusively, to a method for autoaligning the word lines of non-volatile memory matrices, and the description which follows will cover this field of application for convenience of illustration.

BRIEF DESCRIPTION OF THE DRAWINGS

FIG. 7 is a cross sectional view of a portion of a semiconductor substrate during the manufacturing process according to an embodiment of the invention.

DETAILED DESCRIPTION OF THE INVENTION

Figure 1:
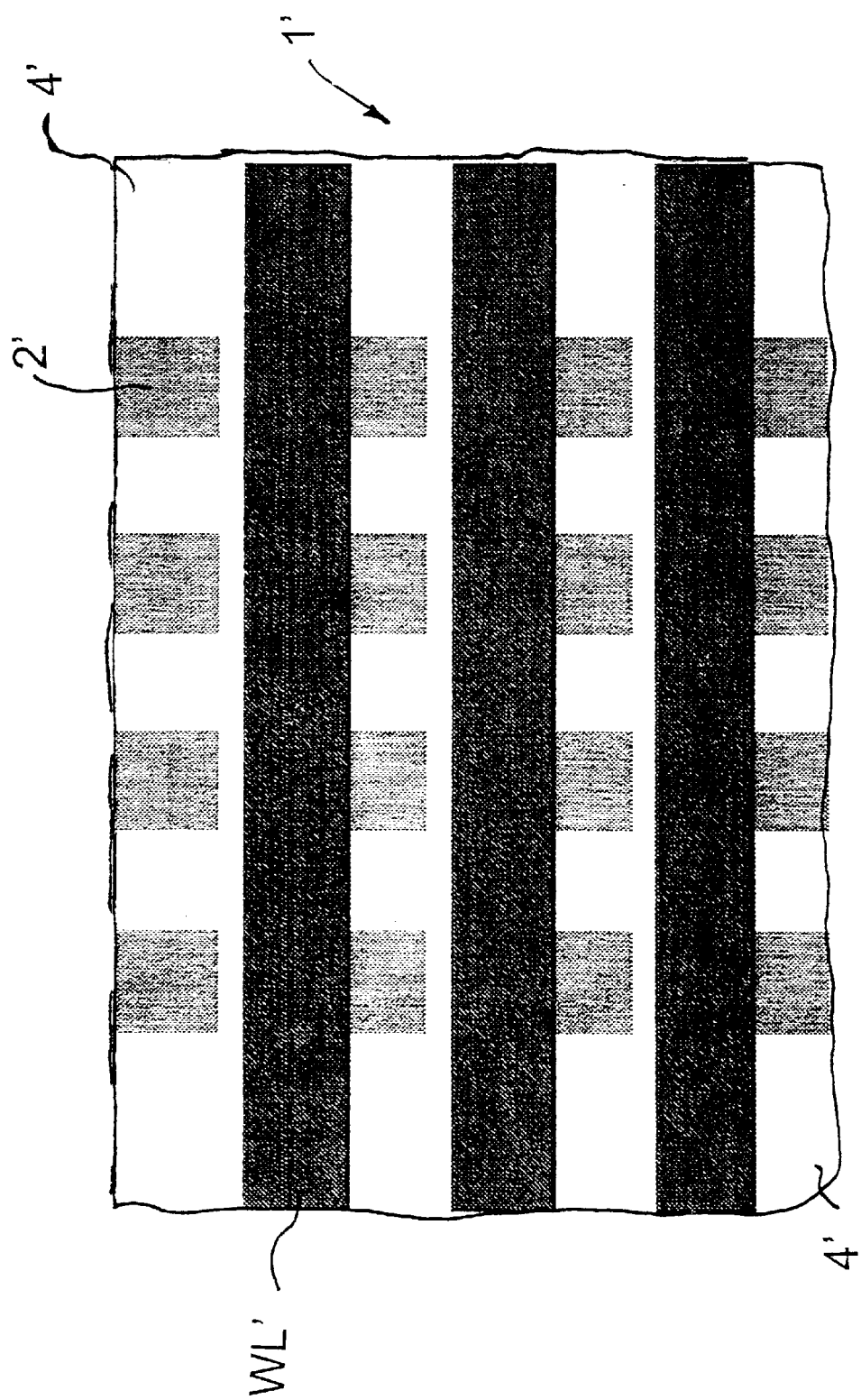
FIG. 1 is a top plan view of a portion of a semiconductor substrate having a series of posts formed thereon which are arranged into rows and columns and to which a series of polysilicon lines are to be aligned.

A method for autoaligning overlapped lines of a conductive material in electronic circuits integrated on a semiconductor substrate will be described with reference to the drawing views. The process steps discussed hereinafter do not describe a complete process of integrated circuit manufacturing. This invention can be practiced in combination with techniques of integrated circuit manufacturing currently employed in the industry, and only such common process steps as are necessary to an understanding of this invention will be considered herein.

Those figures which illustrate schematically portions of an integrated circuit during its manufacturing are no scale drawings, but rather sketches intended to highlight major features of the invention. The following description will cover, in particular, a method for autoaligning overlapped lines of a conductive material as used in the construction of matrices 1 of memory cells, without restricting the scope of the invention to this explained embodiment.

In order to form memory cells comprising MOS devices with having a floating-gate, it is first necessary to form gate regions 3 projecting from a semiconductor substrate 2 and be isolated therefrom by a first layer of gate oxide.

Advantageously, these gate regions 3 consist of a stack structure comprising, in addition to the first layer of gate oxide, a first conductive layer (or POLY1), a second dielectric layer of interpoly, and a second conductive layer (or POLY CAP). Individual layers are not shown in FIG. 2, as they are well known.

The material used for the conductive layer is typically polysilicon, and the intermediate dielectric layer is a typically a multi-layer such as ONO (Oxide-Nitride-Oxide).

A protective dielectric layer, such as a top oxide layer, can then be deposited over the Poly Cap layer.

Figure 2:
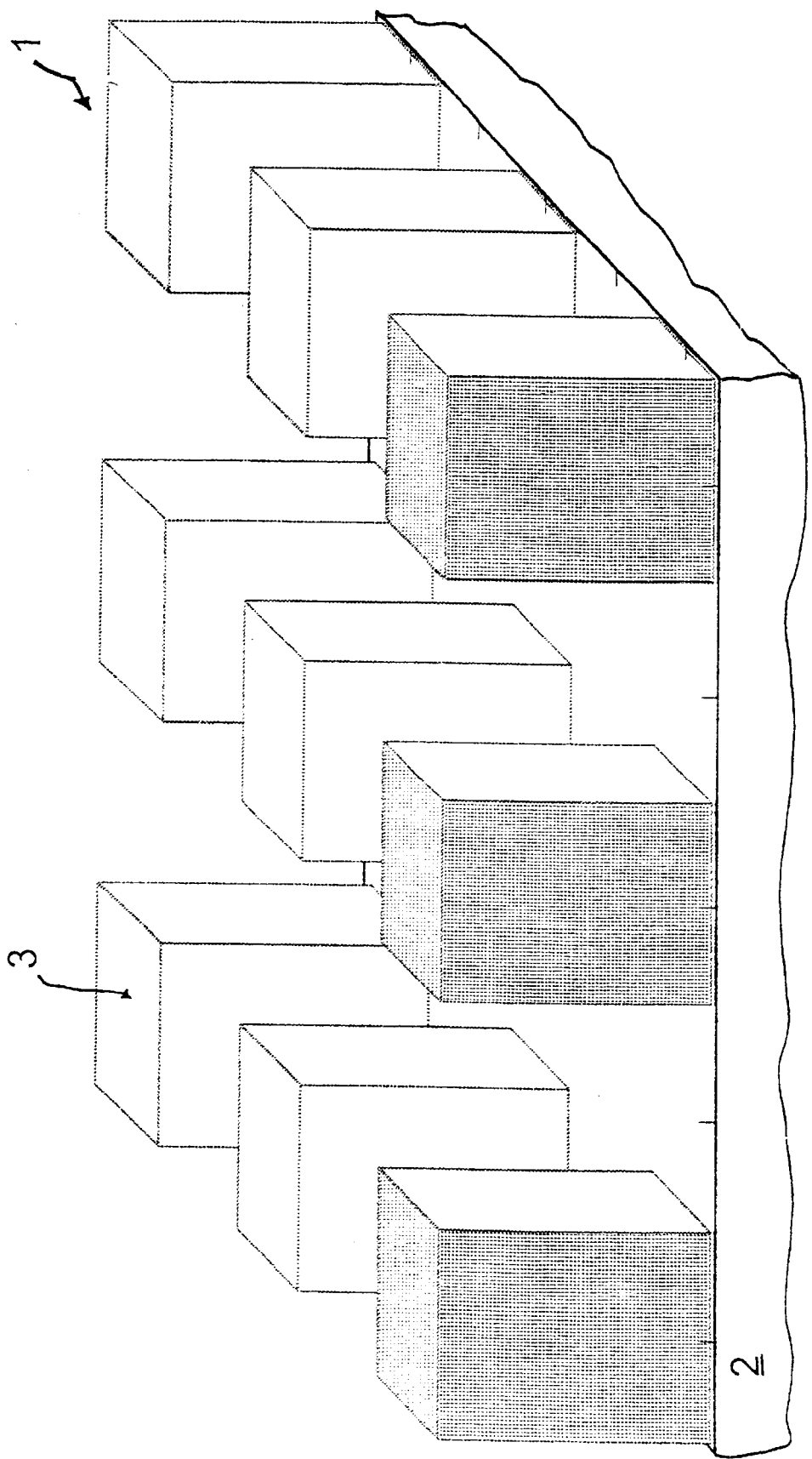
FIGS. 2 to 6 are perspective views of a portion of a semiconductor substrate during the manufacturing process according to embodiments of the invention.
Figure 3:
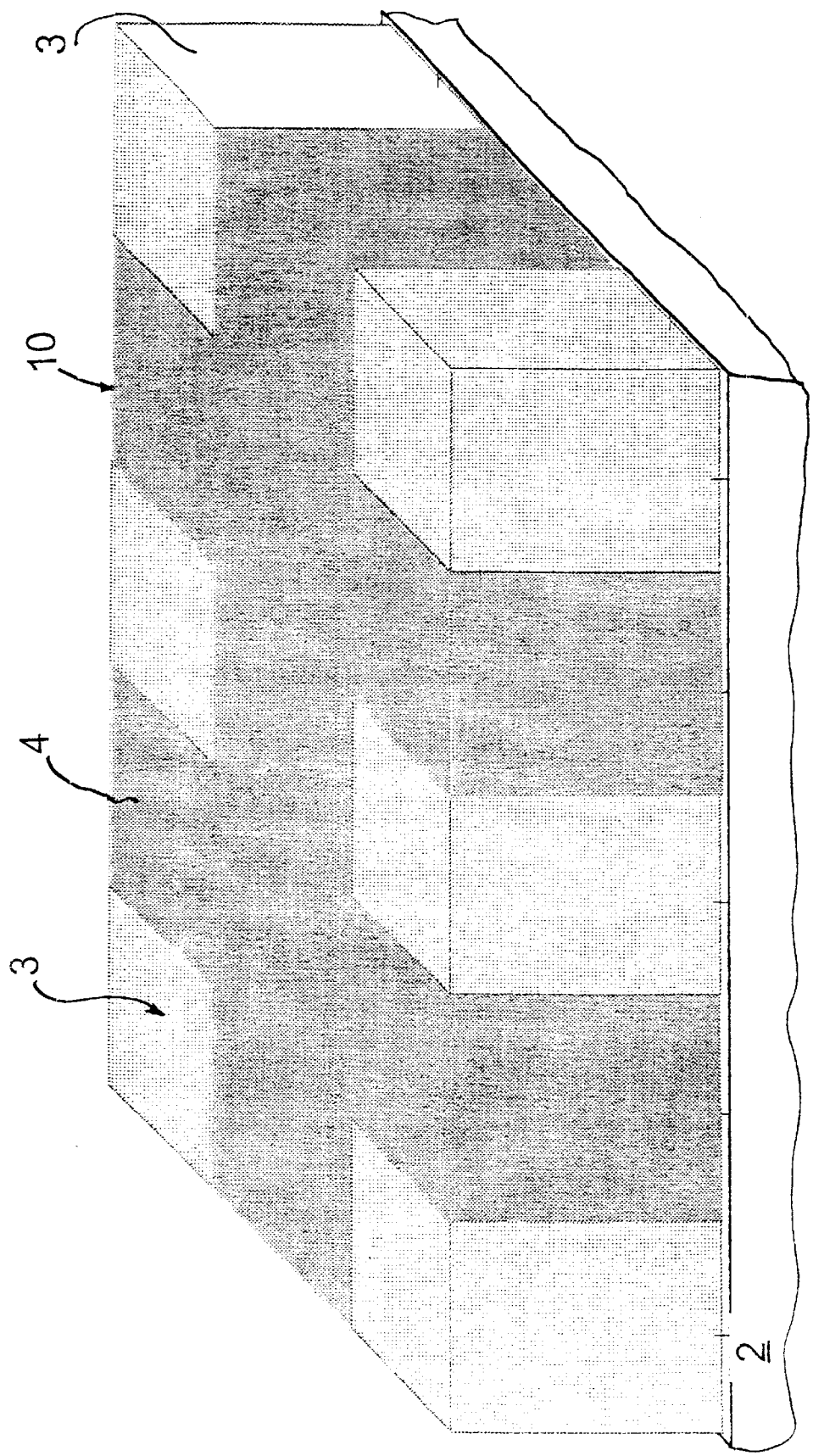

After forming the gate regions 3 as shown in FIG. 2, a fill layer 4 is formed in the gaps between the gate regions 3. A planarizing step is subsequently carried out on the surface 10 to expose the a portion of the conductive layer of the regions 3 from the fill layer 4. This is seen in FIG. 3.

Figure 4:
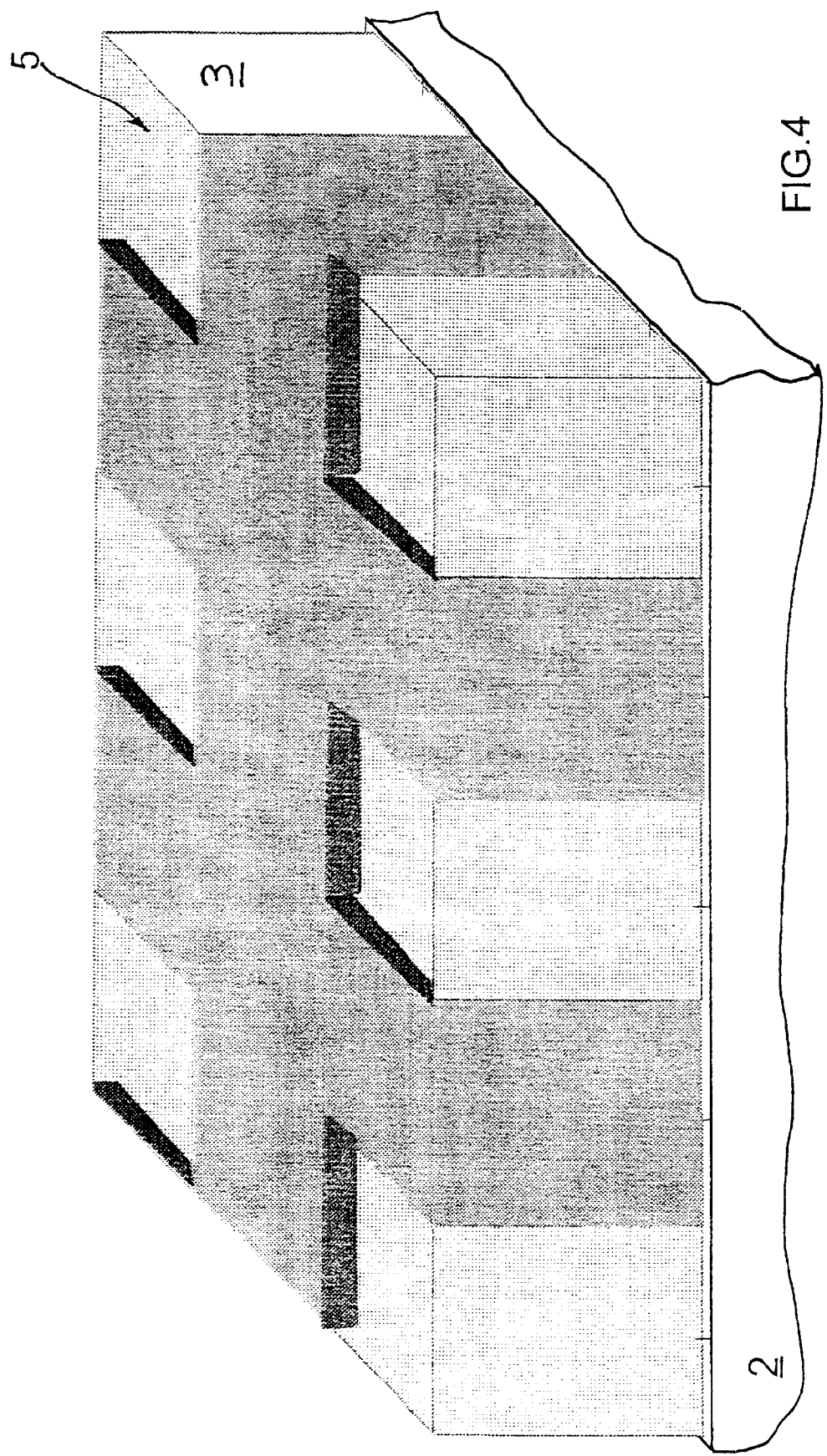

At this step, embodiments of the invention provide for an etching step to be carried out without masking. This is a selective etching which only affects the material composing the surface portion of the regions 3 left bare from the fill layer, but does not effect the fill layer itself. At the end of this etching step, the device surface will therefore exhibit a series of holes 5 at the locations of the regions 3, as illustrated in FIG. 4.

Figure 5:
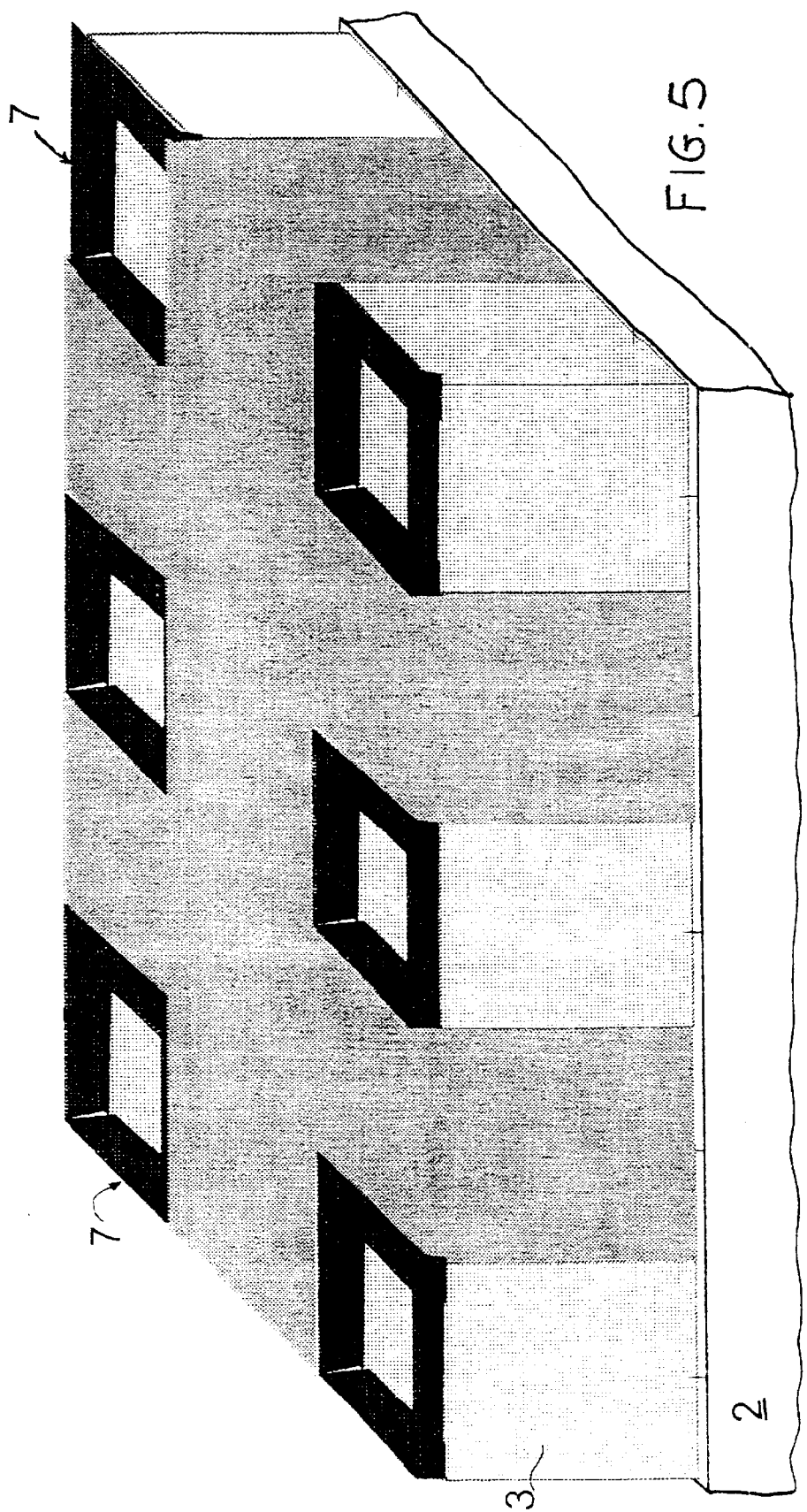
Figure 6:
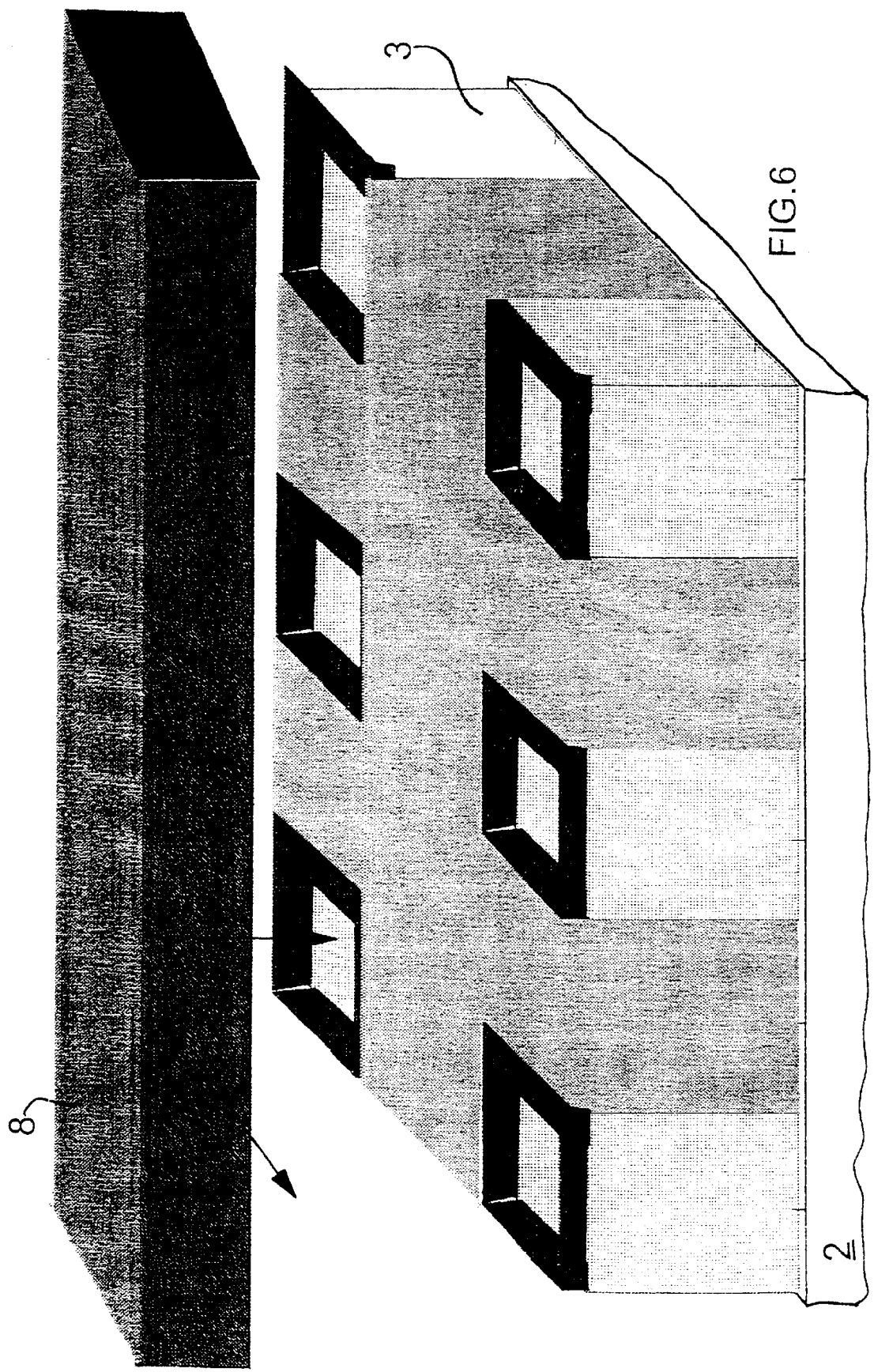

The holes 5 are filled with an insulating layer 6 which is then removed, such as by anisotropic etching, in its central area only, so that a portion of the insulating layer 6 is left around the peripheries of the holes 5. Thus, spacers 7 are defined along the edges of the holes 5, as shown in FIG. 5.

Advantageously, a nitride layer can be formed prior to depositing the insulating layer 6, to act as an etch stopper and to ease the removal of the insulating layer 6.

In a preferred embodiment, the insulating layer 6 is a dielectric layer. In this case, the spacers 7 are formed by anisotropically etching away this dielectric layer, and may have sidewalls that are straight or sloped.

At this step, a first conductive layer 8, and optionally a final conductive layer, are deposited conventionally over the entire exposed surface. Materials such as polysilicon and tungsten silicide (WSi$_2$) are usually employed to form the first conductive layer and final conductive layer, respectively.

A photolithographic step using a mask is carried out and followed by the etching of the conductive layer 8 to define the word lines of the matrix and collimate them to the gate regions 3.

As shown in FIG. 7, where the word lines WL are drawn in positions overlying the gate regions but separated therefrom for clarity, on the occurrence of a misalignment, the etching would stop at the dielectric which comprises the spacers 7.

In other words, if the word lines WL were misaligned in a matrix without the spacers 7, a following etch of the conductive layer to form the word lines WL may damage the upper layer of the gate region 3, which can be made of the same material as the word line WL. However, with the presence of the spacers 7, any etch of the wordlines WL will stop at the spacers 7, even if the patterns for the wordlines WL are misaligned so much that a portion of the spacers 7 are exposed during the etch. There is no problem with the connection of the word lines WL making an adequate electrical connection to the gate regions 3, as the large central portion of the gate regions 3 are exposed, and only the edges of the gate regions 3 are covered by the spacers 7.

Thus, the spacers 7 provide an additional bound to the misalignment of the upper line WL from the corresponding gate regions 3. Compared to the prior art, it is therefore no longer necessary to make the upper line oversized in order to prevent the etching step for forming the line WL from damaging the underlying regions 3 on the occurrence of a misalignment.

In this way, the lines WL can be formed with the same width as the regions 3, thereby affording improved integration of the cell matrix.

However, the method according to embodiments of the invention can also be used to collimate lines of a conductive material belonging to successive lithographic levels. In this case, the above-described regions 3 may be material lines extending along the same direction as the upper line.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method for autoaligning lines of a conductive material in circuits integrated on a semiconductor substrate, comprising:

forming, on said semiconductor substrate, a plurality of regions projecting from a substrate surface and aligned to one another;

forming a fill layer in gaps between said projecting regions;

planarizing said fill layer to expose portions of said projecting regions;

removing a surface portion of said projecting regions to form holes at the locations of said projecting regions;

forming an insulating layer in said holes;

selectively removing the insulating layer to form spacers along edges of said holes;

depositing at least one conductive layer over the exposed surface of the substrate;

patterning the at least one conductive layer by photolithography with a mask; and etching away the at least one conductive layer to define lines and collimate the lines to the underlying regions.

2. The method according to claim 1 wherein forming an insulating layer in said holes comprises forming a dielectric layer.

3. The method according to claim 1, further including, prior to forming an insulating layer in said holes, forming a nitride layer in said holes.

4. A method according to claim 1 wherein removing a surface portion of said regions comprises an unmasked etching.

5. A method according to claim 2, wherein selectively removing the insulating layer to form spacers along the edges of said holes comprises anisotropically etching away the dielectric layer.

6. A method of forming an integrated circuit, comprising:

on a semiconductive substrate, forming a plurality of connection sites extending in a first direction from the substrate, the plurality of connection sites separated from one another by voids;

filling the voids with an insulating material to substantially the level of a height of the plurality of connection sites;

partially etching the plurality of connection sites to form a respective plurality of recesses;

forming a protective structure around a periphery of each of the plurality of recesses;

depositing a conductive layer over the plurality of connection sites; and forming a connection line that is electrically connected to at least one of the plurality of connection sites in the respective recess.

7. The method of claim 6 wherein forming a plurality of connection sites comprises:

forming a gate oxide layer on the substrate;

forming a first polysilicon layer over the gate oxide layer;

forming an interpoly layer over the first polysilicon layer;

forming a second polysilicon layer over the interpoly layer; and patterning and etching at least the second polysilicon layer, the interpoly layer and the first polysilicon layer to form a plurality of stack structures.

8. The method of claim 6 wherein filling the voids with an insulating material to substantially the level of a height of the plurality of connection sites comprises:

depositing an oxide layer over the plurality of connection sites and the semiconductor substrate; and planarizing the oxide layer to expose a portion of the plurality of connection sites.

9. The method of claim 6 wherein forming a protective structure around a periphery of each of the plurality of recesses comprises:

depositing an insulating layer in each of the plurality of recesses; and anisotropically etching portions central in each recess, while preserving portions of the insulating layer around the periphery of each recess.

10. The method of claim 9, further comprising, prior to depositing an insulating layer in each of the plurality of recesses, depositing a nitride layer into each recess.

11. The method of claim 6 wherein forming a connection line that is electrically connected to at least one of the plurality of connection sites in the respective recess comprises patterning and etching portions of the conductive layer to form lines having electrical connections within the recess of the at least one of the plurality of connecting sites.

* * * * *